(12) United States Patent
Yun et al.

(10) Patent No.: US 12,519,468 B2
(45) Date of Patent: Jan. 6, 2026

(54) CIRCUIT BREAKER USING SEMICONDUCTOR

(71) Applicant: LS ELECTRIC CO., LTD., Anyang-si (KR)

(72) Inventors: Dongjin Yun, Anyang-si (KR); Jungwook Sim, Anyang-si (KR); Woonghyeob Song, Anyang-si (KR); Sunghee Kang, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 182 days.

(21) Appl. No.: 18/284,815

(22) PCT Filed: Feb. 14, 2022

(86) PCT No.: PCT/KR2022/095028
§ 371 (c)(1),
(2) Date: Sep. 28, 2023

(87) PCT Pub. No.: WO2022/211605
PCT Pub. Date: Oct. 6, 2022

(65) Prior Publication Data
US 2025/0080110 A1 Mar. 6, 2025

(30) Foreign Application Priority Data
Mar. 29, 2021 (KR) .................. 10-2021-0040462

(51) Int. Cl.
*H03K 17/687* (2006.01)
(52) U.S. Cl.
CPC ................ *H03K 17/6871* (2013.01)
(58) Field of Classification Search
CPC .......... H03K 17/6871; H03K 17/6874; H03K 2217/0009; H03K 17/08142;
(Continued)

(56) References Cited

U.S. PATENT DOCUMENTS

2013/0154391 A1* 6/2013 Urciuoli ............... H04M 1/00
327/109
2020/0014197 A1* 1/2020 Mishrikey ............ H02H 9/025
(Continued)

FOREIGN PATENT DOCUMENTS

JP 2011139553 A 7/2011
JP 2016162713 A 9/2016
(Continued)

OTHER PUBLICATIONS

Office Action for related Japanese Application No. 2023-539772; action dated Jul. 2, 2024; (3 pages).
(Continued)

*Primary Examiner* — Sreeya Sreevatsa
(74) *Attorney, Agent, or Firm* — K&L Gates LLP (57) ABSTRACT

The present invention comprises: a semiconductor switch unit including a first semiconductor switch having a drain terminal connected to a power grid, a second semiconductor switch having a drain terminal connected to a load, and first and second diodes each having a positive electrode and a negative electrode respectively connected to a source terminal and the drain terminal of each semiconductor switch; a bypass circuit which connects the drain terminal of the first semiconductor switch to the source terminal of the second semiconductor switch; and a control unit which supplies a current to the load through the bypass circuit and the second diode by closing the bypass circuit while the first and second semiconductor switches are turned off, and which turns on the first and second semiconductor switches so as to open the bypass circuit so that a current is supplied to the load through the semiconductor switch unit.

14 Claims, 8 Drawing Sheets

(58) Field of Classification Search
CPC .. H03K 17/08104; H01H 9/542; H01H 9/547; H01H 9/548; H02H 1/043; H02H 3/087; H02H 9/001; H02H 7/22; H02H 1/0007; H02H 7/205
USPC .......................................................... 361/115
See application file for complete search history.

(56) References Cited

U.S. PATENT DOCUMENTS

2020/0365345 A1* 11/2020 Telefus ................. G01R 15/202
2021/0257832 A1* 8/2021 Du .......................... H02H 9/021

FOREIGN PATENT DOCUMENTS

| JP | 2020099039 | A | 6/2020 | | |
|----|------------|---|--------|---|---|
| JP | 2022515499 | A | 2/2022 | | |
| JP | 2022533840 | A | 7/2022 | | |
| KR | 101766229 | B1 | 8/2017 | | |
| KR | 101845826 | B1 | 4/2018 | | |
| KR | 20200024069 | A | * 3/2020 | ............ | H02H 7/205 |
| WO | 2018135987 | A1 | 7/2018 | | |

OTHER PUBLICATIONS

Extended European Search Report for related European Application No. 22781724.4; action dated Feb. 24, 2025; (9 pages).
Bal Satarupa, et al.; "Design Considerations of Bidirectional SiC Based DC Solid-State Power Controller for MEA Systems"; IECON 2018; 44th Annual Conference of the IEEE Industrial Electronics Society; Oct. 2018; (9 pages).
International Search Report for related International Application No. PCT/KR2022/095028; action dated Oct. 6, 2022; (2 pages).
Written Opinion for related International Application No. PCT/KR2022/095028; action dated Oct. 6, 2022; (5 pages).
Office Action for related Korean Application No. 10-2021-0040462; action dated Jul. 31, 2023; (5 pages).

* cited by examiner

CIRCUIT BREAKER USING SEMICONDUCTOR

CROSS-REFERENCE TO RELATED APPLICATIONS

This application is the National Stage filing under 35 U.S.C. 371 of International Application No. PCT/KR2022/095028, filed on Feb. 14, 2022, which claims the benefit of earlier filing date of and rights of priority to Korean Application 10-2021-0040462, filed on Mar. 29, 2021, the contents of which are all hereby incorporated by reference herein in their entirety.

FIELD

The present disclosure relates to a circuit breaker, and more particularly to, a solid-state circuit breaker (SSCB) using a power semiconductor switch.

BACKGROUND

When a failure occurs in a power system that supplies power, an abnormal current such as an overcurrent or fault current may flow into a load through the power system. In addition, the abnormal current flowing thereinto may cause a burnout of the load. Therefore, in order to prevent the abnormal current from flowing into the load when a failure of the power system occurs, a circuit breaker may be used to cut off the load from the power system in order to block the flow of current in the load.

Meanwhile, in the case of a mechanical circuit breaker in the related art, it takes a relatively long time period of several tens of milliseconds until a circuit is cut off, and during that time period, there is a problem that an abnormal current flows into the load. Therefore, in recent years, a solid-state circuit breaker (SSCB) capable of high-speed current interruption including a switch configured with a power semiconductor capable of conducting a large current and having a high-speed switching frequency is used. Since such a solid-state circuit breaker electrically cuts off circuit connection using the power semiconductor, it has an advantage of very fast circuit interruption speed.

However, in the case of a solid-state circuit breaker, sensitivity to an overcurrent is high since its circuit interruption speed is very high. As a result, in the case of an inrush current that temporarily increases the current flowing between the power system and the load when the power system and the load are connected to each other to form a circuit, that is, when the load initiates a startup (during an initial startup) as operating power is supplied, there is a possibility of determining it as a fault current to cause a malfunction of cutting off the circuit.

Meanwhile, a typical solid-state circuit breaker may be configured with at least one semiconductor switch disposed between a power source side (power system) and a load side. Furthermore, when a failure occurs at a power source side or a load side, the power semiconductor switch may be turned off to cut off a connection between the power source side and the load side. Accordingly, it may be possible to prevent an abnormal current from flowing into the load side or the power source side.

However, when the circuit is disconnected through a semiconductor switch as described above, a voltage across both ends of the semiconductor switch may increase due to an abnormal current that has already flowed thereinto. Accordingly, a typical solid-state circuit breaker further includes at least one additional circuit, such as a snubber circuit 15 and freewheeling circuits 16a, 16b as shown in FIG. 1, for suppressing a voltage rise due to a residual current.

Figure 1:
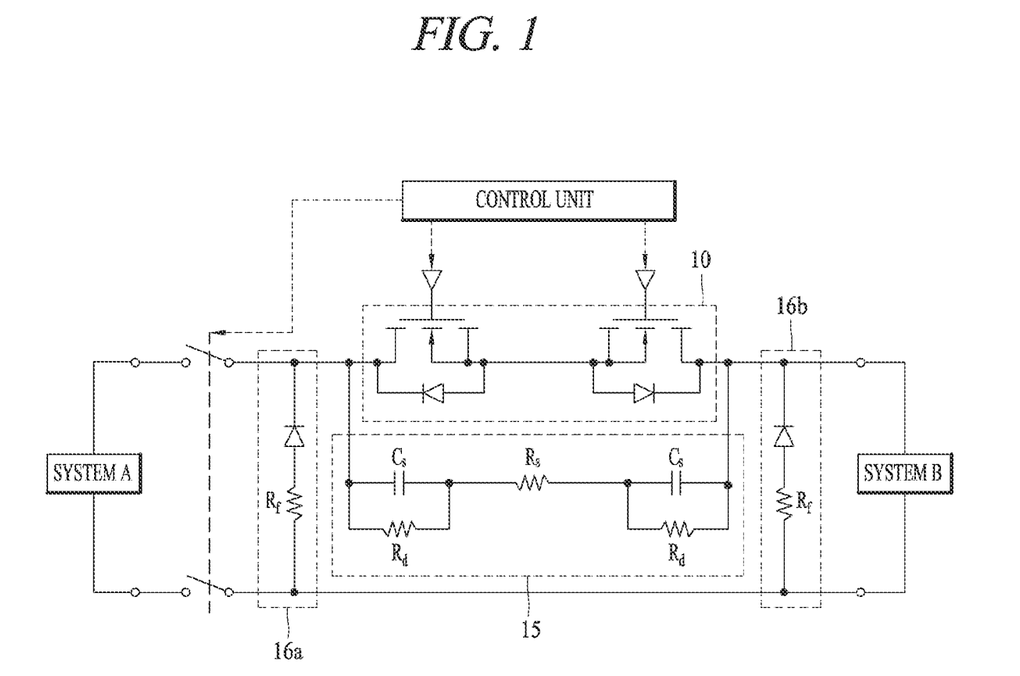
FIG. 1 is a circuit diagram showing a circuit structure of a typical solid-state circuit breaker.

Referring to FIG. 1, the snubber circuit 15 may be disposed in parallel to a main circuit (a circuit 10 in which the semiconductor switch is connected in series thereto), and may include a capacitor Cs and a resistor Rs connected in series thereto. In this case, the semiconductor switches may include diodes arranged in opposite directions to cut off any abnormal current flowing in both directions, and the snubber circuit 15 may include capacitors Cs on both sides of the resistor Rs at the center thereof. Therefore, when a circuit is cut off by an abnormal current, energy stored in either one of the capacitors Cs is discharged to the resistor Rs to consume the energy according to the residual current.

In addition, the solid-state circuit breaker shown in FIG. 1 may include first and second freewheeling circuits 16a, 16b in which a forward diode Df and a resistor Rf connected to the ground are connected in series. In this case, when the circuit is cut off due to an abnormal current, a residual current may flow to the freewheeling circuits 16a, 16b, and energy may be consumed through the diodes and resistors included in the freewheeling circuits.

However, in the case of the freewheeling circuits 16a, 16b, a resistor having a higher resistance value is required in order to resolve larger residual current energy, and accordingly, there is a problem in that a larger resistor is required. In addition, in the case of the snubber circuit 15, an amount of energy that can be consumed is determined according to a capacitance of the capacitor Cs, and thus there is a problem in that a large capacitor is required to resolve the energy of a large residual current. Accordingly, there is a problem in that sizes of the freewheeling circuit and the snubber circuit are increased in order to sufficiently resolve the residual energy.

Meanwhile, as in an operation sequence of a typical solid-state circuit breaker, when a solid-state circuit breaker and a power system are first connected to each other through a mechanical switch (e.g., relay switch) and semiconductor switches are turned on to connect a load to the power system, a current flowing in first from the power system connected through the mechanical switch may be stored in the snubber circuit 15. Furthermore, when the semiconductor switches are turned on for circuit connection, the current stored in the snubber circuit 15 may be discharged.

Meanwhile, when the semiconductor switches are turned on, an inrush current may be generated due to an initial startup of a load. In addition, when the current accumulated in the snubber circuit 15 is discharged in a state in which an inrush current is generated, a limit of energy that can be dissipated in the resistance Rs of the snubber circuit 15 may be exceeded. Accordingly, when a solid-state circuit breaker operates according to a typical sequence, there is a problem in that the possibility of a malfunction of the solid-state circuit breaker increases due to an inrush current.

In addition, since a discharge current phenomenon caused by the discharged current may increase a current flowing into the solid-state circuit breaker, there is a problem of causing a control sequence error of the solid-state circuit breaker.

SUMMARY

An aspect of the present disclosure is to solve the above-described problems and other problems, and to provide a solid-state circuit breaker having excellent performance in consuming the energy of a residual current due to circuit interruption and having a smaller size, and a method of controlling the solid-state circuit breaker.

Furthermore, another aspect of the present disclosure is to provide a solid-state circuit breaker capable of preventing a discharge current from being generated when operated according to a typical operation sequence so as to lower the possibility of a malfunction of the solid-state circuit breaker, and a method of controlling the solid-state circuit breaker.

In addition, still another aspect of the present disclosure is to provide a solid-state circuit breaker capable of preventing a malfunction in which a circuit is cut off by an inrush current generated when a power system and a load are connected to form the circuit, and a method of controlling the solid-state circuit breaker.

In order to achieve the foregoing and other objectives of the present disclosure, according to an aspect of the present disclosure, there is provided a solid-state circuit breaker disposed between a power system and a load, the solid-state circuit breaker including a cut-off switch physically connecting or disconnecting the solid-state circuit breaker to or from the power system, a semiconductor switch unit comprising a first semiconductor switch having a drain terminal connected to the power system, a second semiconductor switch having a drain terminal connected to the load, and first and second diodes having anodes and cathodes respectively connected to source terminals and drain terminals of the respective semiconductor switches, a bypass electric circuit connecting the drain terminal of the first semiconductor switch and the source terminal of the second semiconductor switch, and a control unit that closes the bypass electric circuit to supply a current of the power system to the load through the bypass electric circuit and the second diode while the first and second semiconductor switches are turned off when the power system and the solid-state circuit breaker are connected through the cut-off switch, and turns on the first and second semiconductor switches to form a first electric circuit through which the power system and the load are connected by way of the semiconductor switch unit, and opens the bypass electric circuit to supply the current of the power system to the load through the first electric circuit when a preset condition is satisfied.

According to an embodiment, for the bypass electric circuit, the opening or closing of the bypass electric circuit may be controlled by a bypass switch, and the bypass switch may be a fast switch (FS) having a switching speed above a preset speed.

According to an embodiment, the bypass electric circuit may further include at least one resistor, which is an inrush current suppression resistor, for suppressing an inrush current generated when the power system and the load are initially connected.

According to an embodiment, when the current of the power system is applied to the drain terminal of the first semiconductor switch while the first and second semiconductor switches are turned off, the bypass electric circuit may further include an induction diode for inducing the applied current into the bypass electric circuit and preventing a reverse current flow due to a reverse voltage.

According to an embodiment, the solid-state circuit breaker may further include a current sensor that measures a current flowing in from the power system, wherein the control unit determines that the preset condition is satisfied when a current level between the power system and the load is restored to a rated current level as a result of the measurement by the current sensor.

According to an embodiment, the control unit may control the cut-off switch to disconnect the solid-state circuit breaker from the power system when the current level between the power system and the load is not restored to the rated current level for more than a predetermined time period as a result of the measurement by the current sensor.

According to an embodiment, the control unit may determine that the preset condition is satisfied when a preset time period has elapsed from a time point at which the bypass electric circuit is closed.

According to an embodiment, the solid-state circuit breaker may further include a transient voltage suppressor (TVS) device configured to be connected in parallel to the semiconductor switch unit to consume a residual current generated from both ends of the semiconductor switch unit due to a circuit connection cut-off when circuit connection is cut off.

According to an embodiment, the first and second semiconductor switches may be configured with N-channel MOSFET devices having source and terminals disposed in opposite directions to be connected in series with each other.

In addition, according to the present disclosure, there is provided a method of controlling a solid-state circuit breaker disposed between a power system and a load, the method including controlling a cut-off switch to connect the power system and the solid-state circuit breaker, closing a bypass electric circuit connecting a drain terminal of a first semiconductor switch having the drain terminal connected to the power system and a source terminal of a second semiconductor switch having a drain terminal connected to the load to supply a current of the power system to the load through a second diode having an anode and a cathode connected to the source and drain terminals of the second semiconductor switch, respectively, detecting whether a preset condition is satisfied, turning on the first and second semiconductor switches according to whether the preset condition is satisfied to form a first electric circuit through which the power system and the load are connected to each other, and opening the bypass electric circuit to supply the current of the power system to the load through the first electric circuit.

According to an embodiment, for the bypass electric circuit, the opening or closing of the bypass electric circuit may be controlled by a bypass switch, and the bypass switch may be a fast switch (FS) having a switching speed above a preset speed.

According to an embodiment, the bypass electric circuit may further include at least one resistor, which is an inrush current suppression resistor, for suppressing an inrush current generated when the power system and the load are initially connected.

According to an embodiment, when the current of the power system is applied to the drain terminal of the first semiconductor switch while the first and second semiconductor switches are turned off, the bypass electric circuit may further include an induction diode for inducing the applied current into the bypass electric circuit and preventing a reverse current flow due to a reverse voltage.

According to an embodiment, the solid-state circuit breaker may further include a current sensor that measures a current flowing in from the power system, and the detecting of whether the preset condition is satisfied may be determining that the preset condition is satisfied when a current level between the power system and the load is restored to a rated current level as a result of the measurement by the current sensor.

According to an embodiment, the detecting of whether the preset condition is satisfied may further include detecting a time period for which the detected current level exceeds a rated current level as a result of the measurement by the current sensor, determining whether the detected time period is a predetermined time period, and controlling the cut-off switch according to a result of the determination to cut off the solid-state circuit breaker from the power system.

According to an embodiment, the detecting of whether the preset condition is satisfied may further include detecting an elapsed time period from a time point at which the bypass electric circuit is closed, and determining that the preset condition is satisfied when the detected time period is above a preset time period.

The effects of a solid-state circuit breaker and a control method thereof according to the present disclosure will be described as follows.

According to at least one of embodiments of the present disclosure, a solid-state circuit breaker according to the present disclosure may use a transient voltage suppressor (TVS) device instead of a snubber circuit and a freewheeling circuit to consume the energy of a residual current due to circuit interruption, thereby having an effect capable of greatly reducing its size while having an excellent energy consumption effect.

According to at least one of embodiments of the present disclosure, a solid-state circuit breaker according to the present disclosure may first connect a power system to a load through a bypass electric circuit having an inrush current suppression resistor when the power system is connected thereto, and connect the power system to the load by way of semiconductor switches after an inrush current is extinguished, thereby having an effect capable of suppressing a discharge current caused by a snubber circuit from being generated as well as preventing a malfunction in which a circuit is cut off by the inrush current.

DETAILED DESCRIPTION

It is noted that the technical terms used herein are used only to describe specific implementations and are not intended to limit the invention. A singular representation used herein may include a plural representation unless it represents a definitely different meaning from the context. In general, suffixes such as "module" and "unit" may be used to refer to elements or components. Use of such suffixes herein is merely intended to facilitate description of the specification, and the suffix itself is not intended to give any special meaning or function.

In this application, the terms "comprising" and "including" should not be construed to necessarily include all of the elements or steps disclosed herein, and should be construed not to include some of the elements or steps thereof, or should be construed to further include additional elements or steps.

In describing the technology disclosed in this specification, if a detailed explanation for a related known function or construction is considered to unnecessarily divert the gist of the present disclosure, such explanation has been omitted but would be understood by those skilled in the art.

Also, it should be understood that the accompanying drawings are merely illustrated to easily explain the concept of the invention, and therefore, they should not be construed to limit the technological concept disclosed herein by the accompanying drawings, and the concept of the present disclosure should be construed as being extended to all modifications, equivalents, and substitutes included in the concept and technological scope of the invention. In addition, it will be understood that the implementations described below, as well as combinations of implementations, are changes, equivalents, or substitutes included in the scope of the present disclosure and correspond to the scope of the present disclosure.

First, in order to help a complete understanding of the present disclosure, the basic principle of the present disclosure will be described, which may allow the energy of a residual current to be consumed by using a transient voltage suppressor (TVS) device that clamps a transient voltage, instead of a snubber circuit or a freewheeling circuit including a number of circuit components such as capacitors and resistors. Accordingly, the size of a solid-state circuit breaker can be reduced by using only one relatively small-sized TVS device instead of relatively large-sized capacitors and resistors.

Furthermore, when a solid-state circuit breaker and a power system are initially connected through a mechanical switch, the present disclosure allows the power system and the load to be connected through a bypass electric circuit having an inrush current suppression resistor, thereby suppressing an inrush generated at an initial startup of the load as well as connecting between the power system and the load through semiconductor switches after the inrush current is extinguished. Therefore, a discharge current by a snubber circuit may not be generated so as to prevent a malfunction of the solid-state circuit breaker due to an inrush current.

Figure 2:
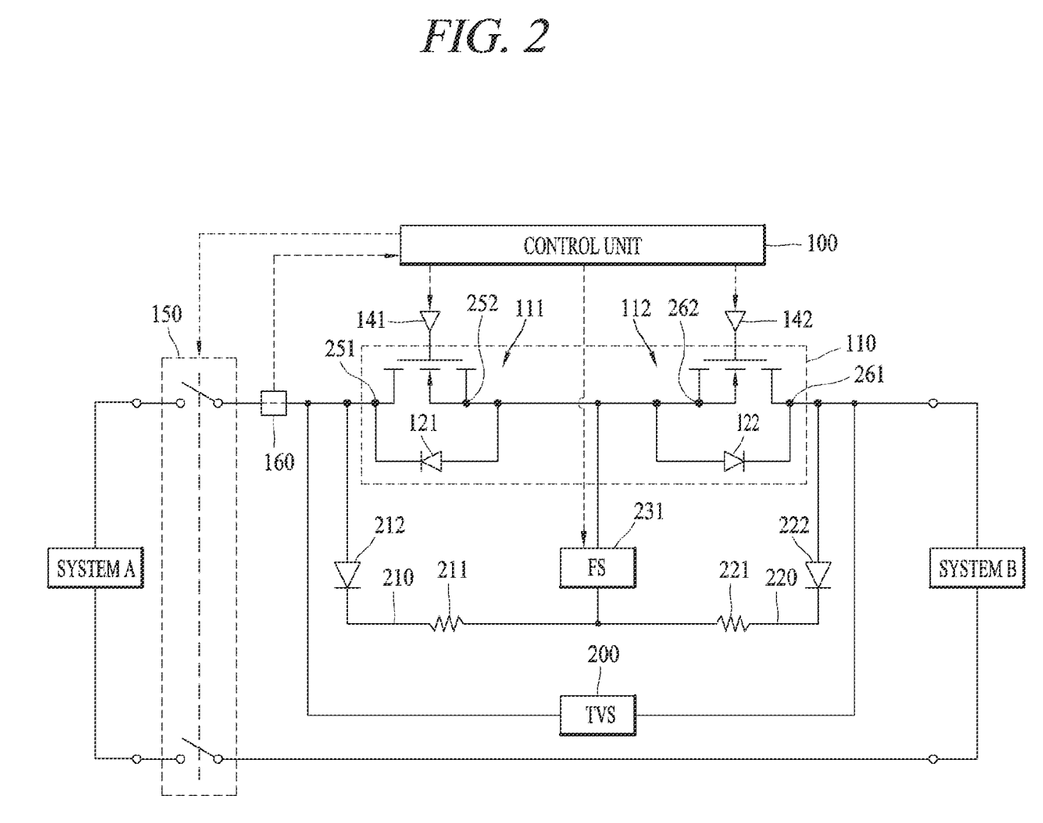
FIG. 2 is a circuit diagram showing a circuit structure of a solid-state circuit breaker having a TVS device according to an embodiment of the present disclosure.

FIG. 2 is a circuit diagram showing such a circuit structure of a solid-state circuit breaker according to an embodiment of the present disclosure.

Referring to FIG. 2, a solid-state circuit breaker according to an embodiment of the present disclosure may include a semiconductor switch unit 110 including a first semiconductor switch 111 and a second semiconductor switch 112 that can be turned on/off between system A and system B and are connected in series with each other.

Here, the system A and the system B may be different power systems. For an example, the system A and the system B may be different micro grids. In this case, a bidirectional current flow may be formed from the system A to the system B as well as from the system B to the system A.

Alternatively, the system A may be a power system and the system B may be a load. In this case, a current flow may be formed from the system A to the system B. Alternatively, the system A may be a load and the system B may be a power system. In this case, a current flow may be formed from the system B to the system A.

For such a bidirectional cut-off, the first semiconductor switch 111 and the second semiconductor switch 112 may be configured to cut off a circuit not only when current flows from system A to system B, but also when current flows from the system B to the system A. For an example, the first semiconductor switch 111 and the second semiconductor switch 112 may be semiconductor switches configured with N-channel MOSFET devices in which a source and a drain are disposed in opposite directions.

However, the present disclosure is, of course, not limited thereto, and any devices, for example, IGBT, GTO, IGCT, or the like, that can be turned on/off by a gate voltage controlled by a control unit 100, may be used instead of the MOSFET device, for the first and second semiconductor switches 111, 112. However, in the following description, for convenience of description, it will be described on the assumption that the first and second semiconductor switches 111 and 112 are configured with N-channel MOSFET devices.

Meanwhile, the first semiconductor switch 111 and the second semiconductor switch 112 may further include first and second diodes 121, 122 disposed in opposite directions to the flow of a current to prevent damage to the MOSFET devices due to a reverse voltage when a circuit is cut off by a fault current. In this case, an anode and a cathode of each of the first and second diodes 121, 122 may be connected to a source terminal and a drain terminal of each of the MOSFET devices 111, 112.

Therefore, the first diode 121 may be connected in parallel to the MOSFET device of the first semiconductor switch 111 and disposed in an opposite direction to a current flowing from the system A to the system B. In addition, the second diode 122 may be connected in parallel to the MOSFET device of the second semiconductor switch 112 and disposed in an opposite direction to a current flowing from the system B to the system A. As described above, a solid-state circuit breaker 10 according to an embodiment of the present disclosure may include the first semiconductor switch 111 and the second semiconductor switch 112 configured in a complementary symmetrical manner to cut off any fault current flowing in both directions.

In the following description, for convenience of explanation, it will be described on the assumption that system A is a power system and system B is a load. However, as described above, the solid-state circuit breaker 10 according to an embodiment of the present disclosure is configured to cut off any fault current flowing in both directions, and the present disclosure is, of course, not limited thereto.

Meanwhile, a cut-off switch 150 may cut off connection from any one system to a solid-state circuit breaker and another system. The cut-off switch 150 may be a mechanical switch, which may physically separate a solid-state circuit breaker to cut off other systems or loads from a power system in which an accident occurs.

As shown in FIG. 2, the cut-off switch 150 may be disposed between the system A and the semiconductor switch unit 110. Meanwhile, the location of the cut-off switch 150 may not be limited thereto, and may be disposed at any other location (e.g., between the system B and the semiconductor switch unit 110).

Meanwhile, the first and second semiconductor switches 111, 112, which are switches configured with power semiconductors such as MOSFETs, may have a very fast switching speed, whereas the cut-off switch 150 may have a slow switching speed. Therefore, the cut-off switch 150 may cut off a circuit after the first and second semiconductor switches 111, 112 cut off the circuit, and as a result, a fault current that has already flowed into the solid-state circuit breaker may remain (hereinafter, a residual current). In order to consume the energy of a residual current generated by circuit interruption as described above, a solid-state circuit breaker according to an embodiment of the present disclosure may include a TVS device 200.

The TVS device 200, which is a clamp device that clamps an output voltage to a predetermined level of voltage, may be a device that protects a circuit by limiting the output of a voltage above a predetermined level when a transient voltage is applied thereto. The TVS device 200 may be conducted to clamp a high voltage applied thereto using an avalanche effect to allow a higher current to be conducted and grounded without sustaining damage due to the clamp function.

As such, the TVS device 200 is a device for suppressing a transient voltage, but the TVS device 200 may allow a higher current to be conducted and grounded for clamping, thereby consuming the energy of a residual current generated when the circuit is cut off.

The TVS device 200 may be connected in parallel to the semiconductor switch unit 110. Accordingly, when the circuit is cut off by the first and second semiconductor switches 111, 112, both ends of the semiconductor switch unit 110 may be connected through the TVS device 200. In this case, an output voltage over a predetermined level may be limited by the TVS device 200, thereby preventing a fault current due to a ground fault or a short circuit fault occurring in a system from flowing into another system by way of the TVS device 200.

Furthermore, first and second gate drivers 141, 142 may apply gate voltages to the gate terminals of the first and second semiconductor switches 111, 112, respectively, under the control of the control unit 100. In this case, when a gate voltage exceeding a threshold voltage of each of the first and second semiconductor switches 111, 112 is applied, a resistance value of an output terminal of each of the first and second semiconductor switches 111, 112 may be smaller than that of an input terminal thereof.

Therefore, input terminals and output terminals of the first and second semiconductor switches 111, 112 are conducted to allow system A and system B to be electrically connected to each other. Hereinafter, a gate voltage above a threshold voltage being applied to allow the input terminal and the output terminal to be conducted to each other will be referred to as a semiconductor switch being turned on.

On the contrary, when each of the first and second gate drivers 141, 142 applies a gate voltage lower than a preset threshold voltage to the gate terminal of each of the first and second semiconductor switches 111, 112, or does not apply the gate voltage, a resistance value of the output terminal of each of the first and second semiconductor switches 111, 112 may be equal to or greater than that of the input terminal thereof.

Accordingly, input terminals and output terminals of the first and second semiconductor switches 111, 112 may not be conducted to each other, and the system A and the system B may be electrically separated (insulated) and disconnected from each other. Hereinafter, a gate voltage lower than a threshold voltage being applied to allow the input terminal and the output terminal not to be conducted to each other will be referred to as a semiconductor switch being turned off.

A current sensor 160 may measure a magnitude of a current flowing between the system A and the system B. Then, the measured magnitude of the current may be transmitted to the control unit 100. Accordingly, when a current above a preset magnitude is detected as a result of the measurement by the current sensor 160, it may be determined that an inrush current or a fault current is generated.

As shown in FIG. 2, the current sensor 160 may be disposed between the semiconductor switch unit 110 and the system A, but the present disclosure is not limited thereto. For an example, the current sensor may be disposed between the semiconductor switch unit 110 and the system B.

Meanwhile, a solid-state circuit breaker according to an embodiment of the present disclosure may include a bypass electric circuit connecting a drain terminal of each semiconductor switch and a source terminal of another semiconductor switch. That is, the solid-state circuit breaker according to the embodiment of the present disclosure may include a first bypass electric circuit 210 connecting a drain terminal 251 of the first semiconductor switch 111 and a source terminal 262 of the second semiconductor switch 112, and a second bypass electric circuit 220 connecting a drain terminal 261 of the second semiconductor switch 112 and a source terminal 252 of the first semiconductor switch 111.

Furthermore, the first bypass electric circuit 210 may include at least one resistor (first resistor 211) for suppressing an inrush current flowing in from the system A, and may include a first induction diode 212 for preventing a reverse current flow due to a reverse voltage and inducing a current flowing in from the system A to the first bypass electric circuit 210. In addition, the second bypass electric circuit 220 may include at least one resistor (second resistor 212) for suppressing an inrush current flowing in from the system B, and may include a second induction diode 222 for preventing a reverse current flow due to a reverse voltage and inducing a current flowing in from the system B to the second bypass electric circuit 220.

Meanwhile, the opening and closing of the first bypass electric circuit 210 and the second bypass electric circuit 220 may be controlled through a bypass switch 231. The bypass switch 231 may be a fast switch having a switching speed above a preset speed, and configured to open and close the first and second bypass electric circuits 210, 220 at high speed under the control of the control unit 100.

The bypass switch 231 may be disposed for each of the bypass electric circuit 210, 220, but as shown in FIG. 2, each of the bypass electric circuits 210, 220 may be configured to be connected to the source terminal 262 or 252 of another semiconductor switch by way of one bypass switch 231 so as to control the opening and closing of the first and second bypass electric circuits 210, 220 through the one bypass switch 231.

Meanwhile, the control unit 100 may control an overall operation of a solid-state circuit breaker according to an embodiment of the present disclosure. For an example, when driving of the solid-state circuit breaker starts, the control unit 100 may first turn on the cut-off switch 150 according to a typical operation sequence to connect system A and system B. Then, a power system to which a current is supplied and the semiconductor switch unit 111 may be connected to each other.

Hereinafter, for convenience of description, system A is assumed to be a power system that supplies a current, and system B is assumed to be a system connected to a load that receives the current. In addition, it will be described that a circuit is connected when the cut-off switch 150 is turned on, and the circuit is cut off when the cut-off switch 150 is turned off.

Meanwhile, when the system A and the solid-state circuit breaker are connected as the cut-off switch 150 is turned on, the control unit 100 may first control the bypass switch 231 to close the first bypass electric circuit 210. In this case, each of the semiconductor switches 111, 112 is in a state of not being turned on, that is, in a state of being turned off, and thus the first semiconductor switch 111 may be in a state of being electrically disconnected to the system A as the first semiconductor switch 111 is in a state of being turned off.

In this state, the control unit 100 may turn on the bypass switch 231 to connect the bypass electric circuit. Therefore, when a current is supplied from the system A, the supplied current may be applied to the source terminal 262 of the second semiconductor switch 112 through the first bypass electric circuit 210.

In this case, the second semiconductor switch 112 may also maintain an OFF state. Therefore, the second semiconductor switch 112 may be in a state of being electrically disconnected to the system B.

However, as shown in FIG. 2, for the second diode 122 connected in parallel to the second semiconductor switch 112, an anode and a cathode thereof are connected to the source terminal 262 and the drain terminal 261 of the second semiconductor switch 112, respectively. Therefore, a current applied to the source terminal 262 of the second semiconductor switch 112 may form a forward bias voltage with respect to the second diode 122.

Accordingly, the source terminal 262 and the drain terminal 261 of the second semiconductor switch 112 may be conducted through the second diode 122, and thus the current may be supplied to the system B, that is, a load, through the second diode 122.

Meanwhile, when a current of system A is supplied through the first bypass electric circuit 210 as described above, the current of the system A is transferred to the system B by way of the first resistance 211 included in the first bypass electric circuit 210. Therefore, when an inrush current is generated as the system B, that is, the load is connected to the power system, a magnitude of the inrush current may be suppressed by the first resistor 211. Accordingly, a malfunction of the solid-state circuit breaker in which a circuit is cut off by the inrush current may be prevented.

Meanwhile, the control unit 100 may maintain a state in which the current of system A is supplied to the system B through the first bypass electric circuit 210 until the current state is restored, that is, until the inrush current disappears. In addition, when the inrush current disappears, each of the gate drivers 141, 142 may be controlled to apply a gate voltage above a preset threshold voltage. Then, input and output terminals of the respective semiconductor switches 111, 112 may be conducted to each other by gate voltages applied by the respective gate drivers 141, 142 to allow the respective semiconductor switches 111, 112 to be switched to an ON state.

When the respective semiconductor switches 111, 112 are switched to an ON state as described above, the control unit 100 may control the bypass switch 231 to open the first bypass electric circuit 210. Then, an impedance of the first bypass electric circuit 210 increases infinitely according to the opening of the circuit, and thus a current supplied from the system A may be transferred to the system B by way of an electric circuit formed by electrically conducting an input terminal and an output terminal of each of the semiconductor switches 111, 112 instead of the first bypass electric circuit 210.

Figure 3:
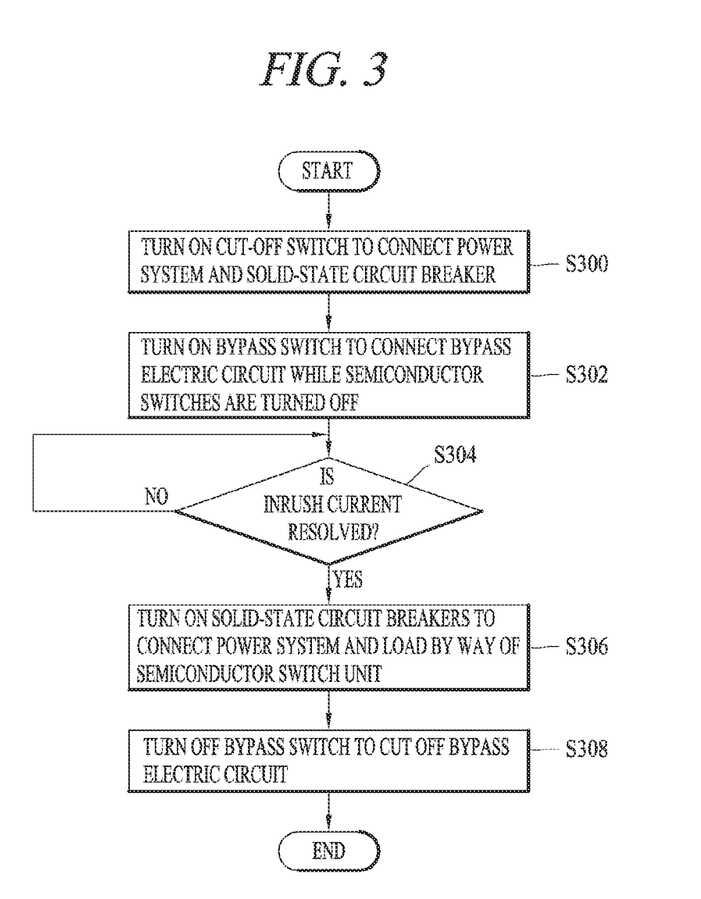
FIG. 3 is a flowchart showing an operation process of connecting between a power system and a load by a solid-state circuit breaker according to an embodiment of the present disclosure.

FIG. 3 is a flowchart showing a control operation process of allowing a control unit to connect between a power system and a load by a solid-state circuit breaker according to an embodiment of the present as described above. Furthermore, FIGS. 4A to 4E are conceptual diagrams sequentially showing current flow between a power system and a load connected according to the operation process of FIG. 3.

Hereinafter, for convenience of description, it will be described on the assumption that system A is a power system and system B is a load.

Figure 4A:
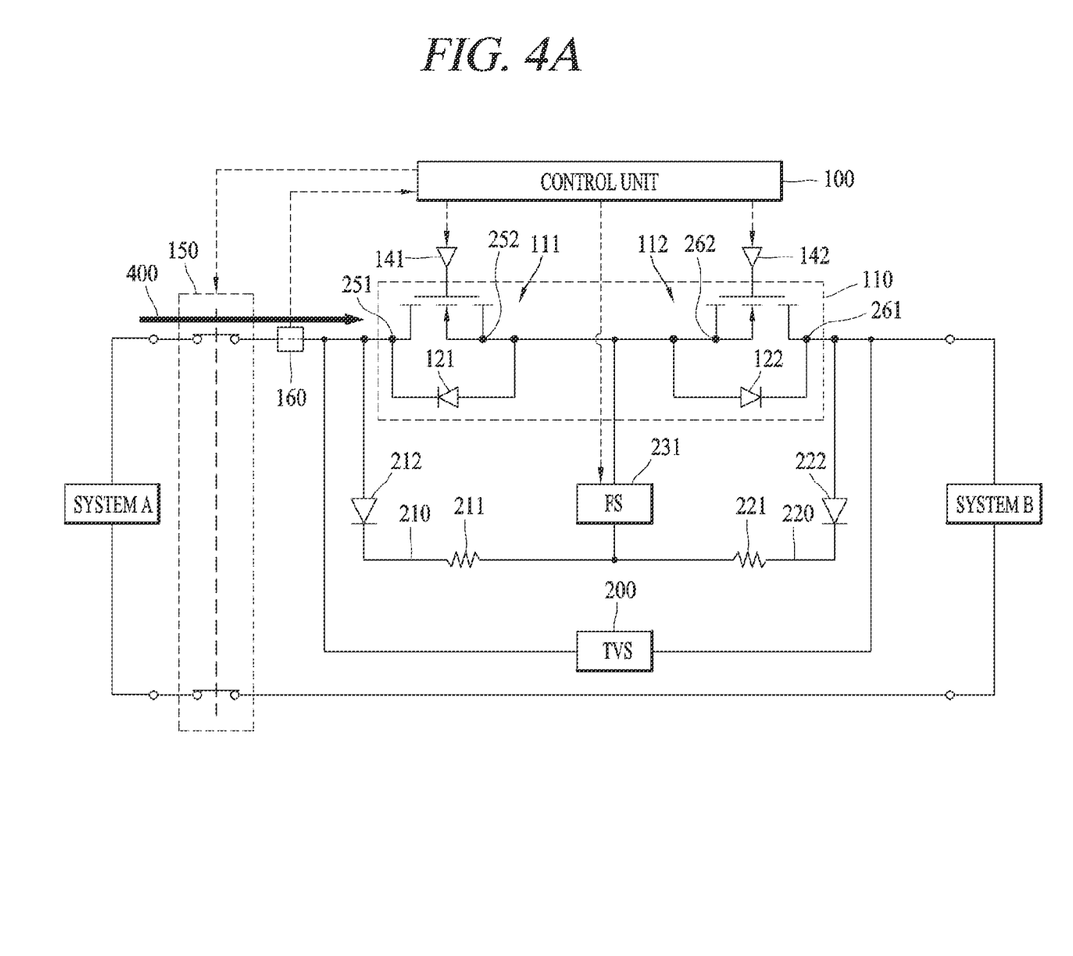
FIGS. 4A to 4E are conceptual diagrams sequentially showing current flow between a power system and a load connected according to the operation process of FIG. 3.

First, referring to FIG. 3, the control unit 100 of the solid-state circuit breaker according to an embodiment of the present disclosure may first turn on the cut-off switch 150 in a state in which the respective semiconductor switches 111, 112 are not turned on when the solid-state circuit breaker starts driving (S300). Then, a power system (system A) and a solid-state circuit breaker may be connected to each other through the cut-off switch 150. Therefore, as shown in FIG. 4A, a current supplied from the system A may flow into the solid-state circuit breaker.

In addition, the control unit 100 may turn on the bypass switch 231 to close a bypass electric circuit while the respective semiconductor switches 111, 112 are turned off (S302). In this case, since each of the semiconductor switches 111, 112 is not turned on, the first semiconductor switch 111 may be in a state in which a gate voltage is not applied, that is, in an OFF state in which an input terminal and an output terminal thereof are not conducted to each other. Therefore, when an electric circuit by way of the first semiconductor switch 111 is in an open state, a current supplied from the system A may form a forward bias voltage for the first induction diode 212, and flow into the first bypass electric circuit 210 along a forward direction of the first induction diode 212.

Figure 4B:
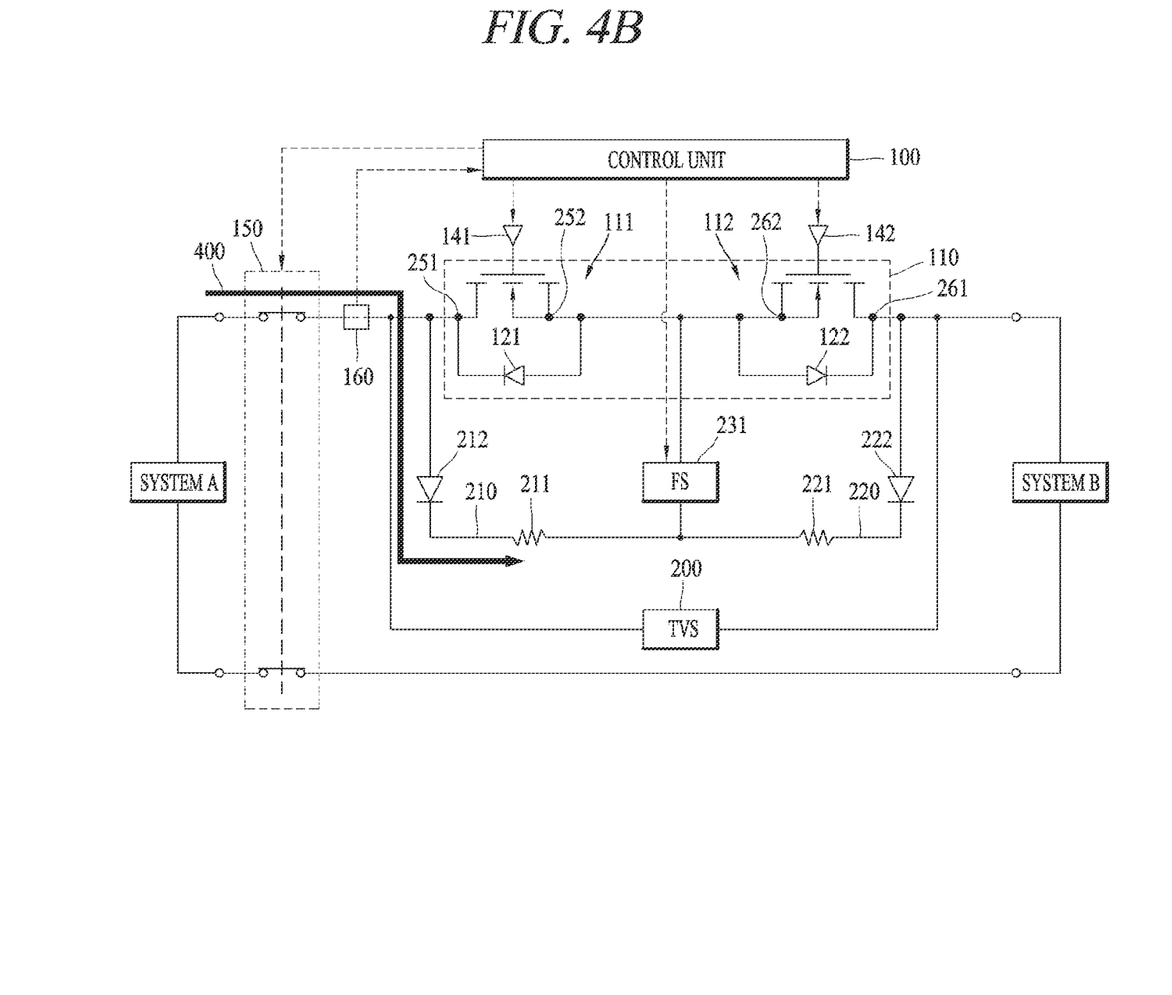
Figure 4C:
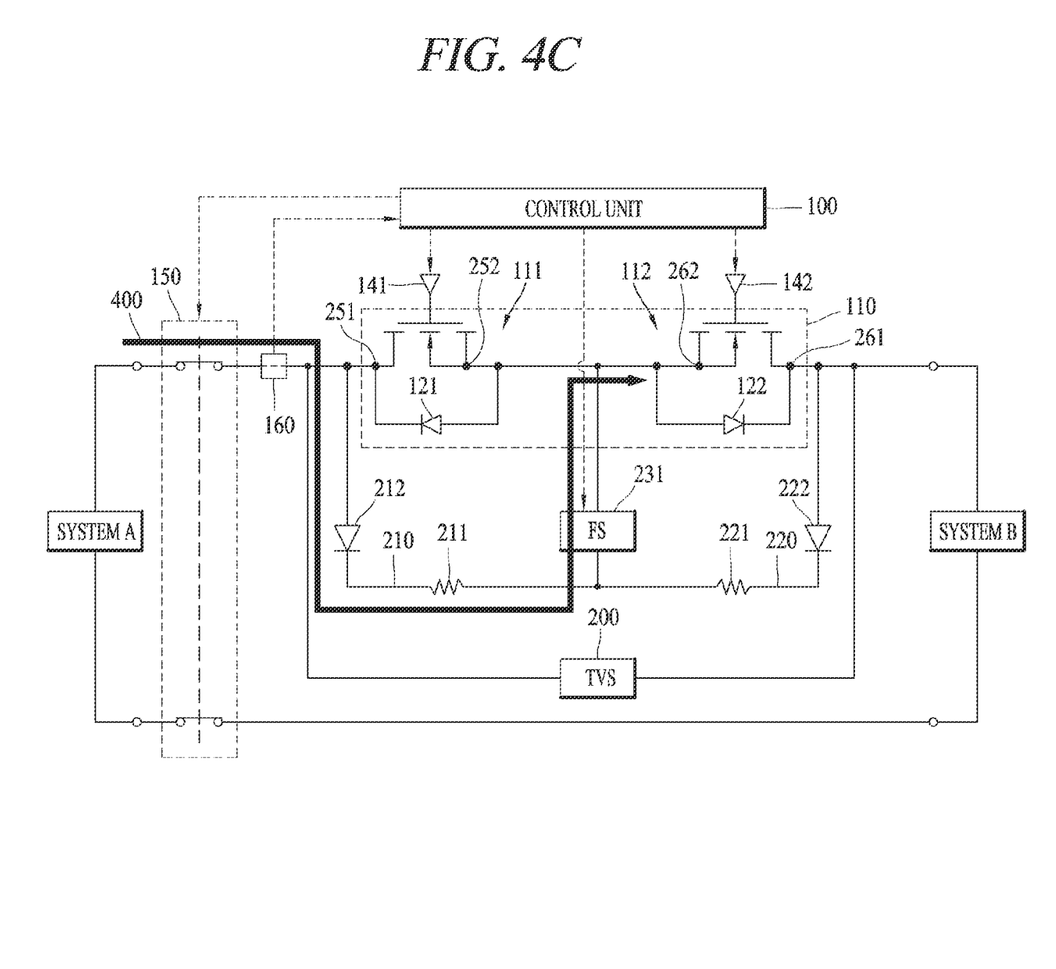

Meanwhile, the first bypass electric circuit 210 may include a first resistor 211 for suppressing a magnitude of an inrush current during the generation of the inrush current. Therefore, as shown in FIGS. 4B and 4C, the current supplied from the system A may be suppressed in magnitude through the first resistor 211, and the suppressed magnitude of the current may be applied to the source terminal 262 of the second semiconductor switch 112.

Meanwhile, the second semiconductor switch 112 may include a second diode 122 having an anode and a cathode connected to the source terminal 262 and the drain terminal 262, respectively. Therefore, the current applied to the source terminal 262 of the second semiconductor switch 112 may be applied to the anode of the second diode 122 to form a forward bias voltage of the second diode 122. Therefore, the current applied to the source terminal 262 of the second semiconductor switch 112 through the first bypass electric circuit 210 may be applied to the drain terminal 261 of the second semiconductor switch 112 through the second diode 122, and accordingly, as shown in FIG. 4D, may be output to the system B through the second diode 122.

Figure 4D:
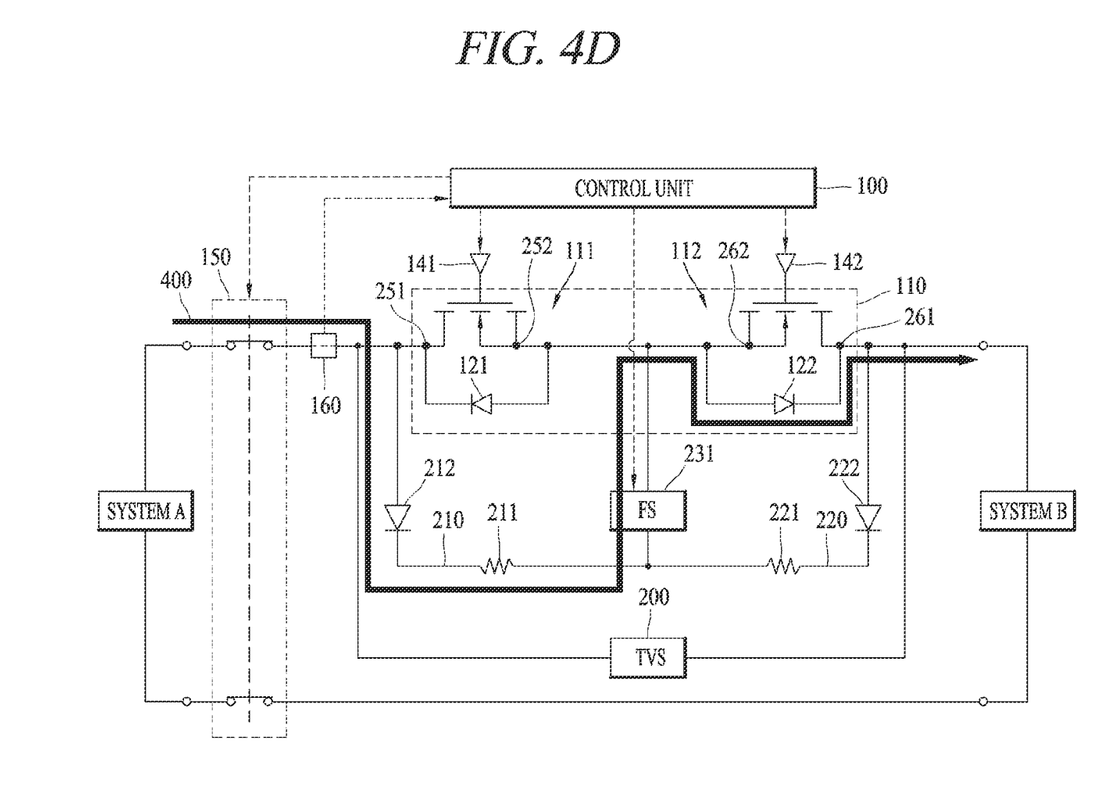

However, as shown in FIG. 4D, when the system A and the system B are connected to each other through the first bypass electric circuit 210, an inrush current may be generated according to an initial startup of the system B, that is, a load. However, as shown in FIG. 2, in the case of the first bypass electric circuit 210, it has the first resistor 211 for suppressing the inrush current, and as a result, when an inrush current is generated, a magnitude thereof may be suppressed by the first resistor 211.

Meanwhile, the control unit 100 may turn on the bypass switch 231 in the step S302 to detect whether the inrush current due to the initial connection between the systems is resolved when the system A and the system B are connected through the bypass electric circuit (S304).

For example, the control unit 100 may determine whether the inrush current is resolved based on a result of the detection by the current sensor 160. In this case, the control unit 100 may determine that the inrush current is resolved when the current level is restored to a rated current level as a result of the detection by the current sensor 160. However, when the current level is not restored for more than a preset time period, the control unit 100 may, of course, determine that a fault current other than an inrush current is generated, and immediately turn off the cut-off switch 150 while the semiconductor switches 111, 112 are not turned on, to cut off the solid-state circuit breaker from the connected system (e.g., system A).

To this end, the step S304 may further include detecting a time period for which the detected current level exceeds a rated current level, determining whether the detected time period is above a preset time period, and turning off the cut-off switch 150 according to a result of the determination.

Alternatively, the control unit 100 may, of course, determine whether the inrush current is resolved according to whether a preset time period has elapsed. Due to the characteristics of an inrush current that is temporarily generated when a power system and a load are initially connected to each other, the inrush current may be naturally resolved after a predetermined time period to restore the current level.

Therefore, when the system A and the system B are connected to each other through a bypass electric circuit, the control unit 100 may detect whether a preset time period has elapsed from a time point at which the connection is made, that is, a time point at which the bypass switch 231 is turned on, and determine that the inrush current is resolved when the preset time period has elapsed.

To this end, the step S304 may further include detecting a time period that has elapsed from a time point at which the bypass electric circuit is closed, and determining that the preset condition is satisfied when the detected time period is above a preset time period.

In this case, the preset time period may be an optimal time period determined based on a plurality of experiment results performed in relation to the present disclosure. Alternatively, it may be a time period arbitrarily set by a user.

Meanwhile, as a result of determining whether the inrush current is resolved in the step S304, when the inrush current is not resolved, the control unit 100 may maintain a current state, that is, a state in which the system A and the system B are connected to each other through a bypass electric circuit. On the contrary, as a result of determining whether the inrush current is resolved in the step S304, when the inrush current is resolved, the control unit 100 may control each gate driver 141, 142 to apply a gate voltage exceeding a preset threshold voltage so as to turn on the semiconductor switches 111, 112 (S306). Then, the input terminal and the output terminal of the respective semiconductor switches 111, 112 may be conducted to each other to form an electric circuit in which the system A and the system B are electrically connected by way of the respective semiconductor switches 111, 112. In this case, a current of the system A may be supplied to the system B through both an electric circuit connecting the system A and the system B by way of the respective semiconductor switches 111, 112 and the first bypass electric circuit 210.

Figure 4E:
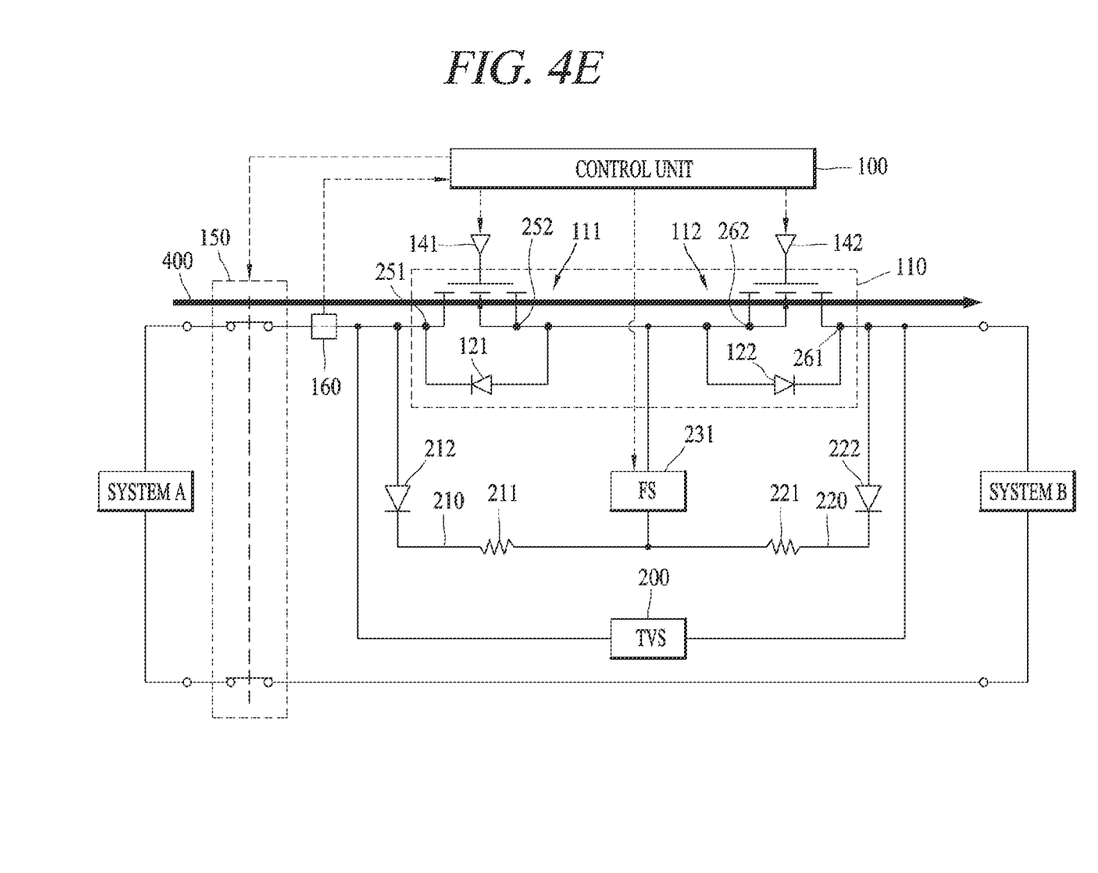

Meanwhile, when an electric circuit connecting the system A and the system B by way of the respective semiconductor switches 111, 112 is formed as described above, the control unit 100 may turn off the bypass switch 231 (S308). Then, a bypass electric circuit, for example, the first bypass electric circuit 210 may be open. Then, an impedance of the first bypass electric circuit 210 becomes infinite, a current flowing in from the system A may flow only into an electric circuit connecting the system A and the system B by way of the respective semiconductor switches 111, 112. Therefore, as shown in FIG. 4E, a current of the system A may be supplied to the system B through an electric circuit connecting the system A and the system B by way of the respective semiconductor switches 111, 112.

On the other hand, in the forgoing description, it has been described that a current of the system A is supplied to the system B through the first bypass electric circuit 210 at the beginning of connection to a load (system B) on the assumption that the current is supplied from the system A, but a current of the system B may of course be supplied to the system A through the second bypass electric circuit 220 at the beginning of connection to the system A.

In this case, when the inrush current due to the connection between the systems disappears, as in the foregoing description, the bypass switch 231 may be turned off under the control of the control unit 100 to open the second bypass electric circuit 220, and accordingly, a current supplied from the system B may be transferred to the system A by way of the semiconductor switches 111, 112.

A control method of a control unit that controls a solid-state circuit breaker in relation to the present disclosure may be implemented as computer-readable codes in a program-recorded medium. The computer-readable medium may include all types of recording devices each storing data readable by a computer system. Examples of such computer-readable media may include hard disk drive (HDD), solid state disk (SSD), silicon disk drive (SDD), ROM, RAM, CD-ROM, magnetic tape, floppy disk, optical data storage element and the like. Also, the computer-readable medium may also be implemented as a format of carrier wave (e.g., transmission via an Internet). Furthermore, the computer may include the control unit of the solid-state circuit breaker.

Therefore, the detailed description should not be limitedly construed in all of the aspects, and should be understood to be illustrative. Therefore, all changes and modifications that fall within the metes and bounds of the claims, or equivalents of such metes and bounds are therefore intended to be embraced by the appended claims.

The invention claimed is:

1. A solid-state circuit breaker disposed between a power system and a load, comprising a current sensor for detecting current flowing from the power system to the load, and configured to perform a circuit breaker operation based on detection results of the current sensor, the solid-state circuit breaker comprising:
    a cut-off switch physically connecting or disconnecting the solid-state circuit breaker to or from the power system;
    a semiconductor switch unit comprising a first semiconductor switch having a drain terminal connected to the power system, a second semiconductor switch having a drain terminal connected to the load, and first and second diodes having anodes and cathodes respectively connected to source terminals and drain terminals of the respective semiconductor switches;
    a bypass electric circuit connecting the drain terminal of the first semiconductor switch and the source terminal of the second semiconductor switch; and
    a control unit that closes the bypass electric circuit to supply a current of the power system to the load through the bypass electric circuit and the second diode while the first and second semiconductor switches are turned off when the power system and the solid-state circuit breaker are connected through the cut-off switch, wherein a turn-off state of the semiconductor switch is a state in which no voltage is applied to a gate terminal or a voltage lower than a preset threshold voltage is applied to the gate terminal, and turns on, when a preset condition is satisfied, the first and second semiconductor switches to form a first electric circuit through which the power system and the load are connected by way of the semiconductor switch unit, and opens the bypass electric circuit to supply the current of the power system to the load through the first electric circuit,
    wherein the control unit determines that the preset condition is satisfied when a current level between the power system and the load is restored to a rated current level as a result of a measurement by the current sensor.

2. The solid-state circuit breaker of claim 1, wherein the opening or closing of the bypass electric circuit is controlled by a bypass switch, and the bypass switch is a fast switch (FS).

3. The solid-state circuit breaker of claim 1, further comprising:
    at least one resistor, which is an inrush current suppression resistor, for suppressing an inrush current generated when the power system and the load are initially connected.

4. The solid-state circuit breaker of claim 1, wherein when the current of the power system is applied to the drain terminal of the first semiconductor switch while the first and second semiconductor switches are turned off, the bypass electric circuit further comprises an induction diode for inducing the applied current into the bypass electric circuit and preventing a reverse current flow due to a reverse voltage.

5. The solid-state circuit breaker of claim 1, wherein the control unit controls the cut-off switch to disconnect the solid-state circuit breaker from the power system when the current level between the power system and the load is not restored to the rated current level for more than a predetermined time period as a result of the measurement by the current sensor.

6. The solid-state circuit breaker of claim 1, wherein the control unit determines that the preset condition is satisfied when a preset time period has elapsed from a time point at which the bypass electric circuit is closed.

7. The solid-state circuit breaker of claim 1, further comprising:
    a transient voltage suppressor (TVS) device configured to be connected in parallel to the semiconductor switch unit to consume a residual current generated from both ends of the semiconductor switch unit due to a circuit connection cut-off when circuit connection is cut off.

8. The solid-state circuit breaker of claim 1, wherein the first and second semiconductor switches are configured with N-channel MOSFET devices having source and terminals disposed in opposite directions to be connected in series with each other.

9. A method of controlling a solid-state circuit breaker comprising a current sensor for detecting current flowing from a power system to a load, and configured to perform a circuit breaker operation based on detection results of the current sensor, disposed between a power system and a load, the method comprising:
    controlling a cut-off switch to connect the power system and the solid-state circuit breaker;
    closing a bypass electric circuit connecting a drain terminal of a first semiconductor switch having the drain terminal connected to the power system and a source terminal of a second semiconductor switch having a drain terminal connected to the load to supply a current of the power system to the load through a second diode having an anode and a cathode connected to the source and drain terminals of the second semiconductor switch, respectively, wherein while current is supplied through the second diode, the first semiconductor switch and the second semiconductor switch are in an turn-off state, wherein the turn-off state of the semiconductor switch is a state in which no voltage is applied to a gate terminal or a voltage lower than a preset threshold voltage is applied to the gate terminal;

detecting whether a preset condition is satisfied;

turning on the first and second semiconductor switches according to whether the preset condition is satisfied to form a first electric circuit through which the power system and the load are connected to each other; and opening the bypass electric circuit to supply the current of the power system to the load through the first electric circuit, and wherein the detecting of whether the preset condition is satisfied is determining that the preset condition is satisfied when a current level between the power system and the load is restored to a rated current level as a result of a measurement by the current sensor.

10. The method of claim 9, wherein the opening or closing of the bypass electric circuit is controlled by a bypass switch, and the bypass switch is a fast switch (FS) having a switching speed above a preset speed.

11. The method of claim 9, further comprising:
at least one resistor, which is an inrush current suppression resistor, for suppressing an inrush current generated when the power system and the load are initially connected.

12. The method of claim 9, wherein when the current of the power system is applied to the drain terminal of the first semiconductor switch while the first and second semiconductor switches are turned off, the bypass electric circuit further comprises an induction diode for inducing the applied current into the bypass electric circuit and preventing a reverse current flow due to a reverse voltage.

13. The method of claim 9, wherein the detecting of whether the preset condition is satisfied further comprises:
detecting a time period for which the detected current level exceeds a rated current level as a result of the measurement by the current sensor;
determining whether the detected time period is a predetermined time period; and
controlling the cut-off switch according to a result of the determination to cut off the solid-state circuit breaker from the power system.

14. The method of claim 9, wherein the detecting of whether the preset condition is satisfied further comprises:
detecting an elapsed time period from a time point at which the bypass electric circuit is closed; and
determining that the preset condition is satisfied when the detected time period is above a preset time period.

* * * * *